(12) United States Patent
Jeon et al.

(10) Patent No.: US 9,443,594 B2
(45) Date of Patent: Sep. 13, 2016

(54) LOGIC EMBEDDED NONVOLATILE MEMORY DEVICE

(71) Applicants: ChangMin Jeon, Yongin-si (KR); Teakwang Yu, Hwaseong-si (KR); Yongtae Kim, Seoul (KR); Boyoung Seo, Suwon-si (KR)

(72) Inventors: ChangMin Jeon, Yongin-si (KR); Teakwang Yu, Hwaseong-si (KR); Yongtae Kim, Seoul (KR); Boyoung Seo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/508,043

(22) Filed: Oct. 7, 2014

(65) Prior Publication Data
US 2015/0131387 A1      May 14, 2015

(30) Foreign Application Priority Data

Nov. 11, 2013    (KR) .................. 10-2013-0136400

(51) Int. Cl.
| | |
|---|---|
| G11C 16/04 | (2006.01) |
| G11C 16/08 | (2006.01) |
| G11C 16/06 | (2006.01) |
| G11C 16/16 | (2006.01) |

(52) U.S. Cl.
CPC .............. G11C 16/08 (2013.01); G11C 16/06 (2013.01); G11C 16/16 (2013.01)

(58) Field of Classification Search
CPC ........... H01L 29/66825; H01L 29/788; H01L 29/42324; H01L 27/11517; H01L 27/1157; H01L 27/2436; H01L 2924/1438; H01L 29/66484; G11C 16/14; G11C 13/0097; G11C 16/16; G11C 11/5635; G11C 13/0028; G11C 14/0018; G11C 14/0045; G11C 16/0441; G11C 16/0416; G11C 16/10
See application file for complete search history.

(56) References Cited

U.S. PATENT DOCUMENTS

| | | | |
|---|---|---|---|
| 5,287,318 A * | 2/1994 | Kuki ...................... | G11C 16/16 365/185.14 |
| 6,377,489 B1 | 4/2002 | Kim et al. | |
| 6,552,932 B1 * | 4/2003 | Cernea ..................... | G11C 7/12 365/185.05 |
| 7,006,381 B2 | 2/2006 | Dormans et al. | |
| 7,095,657 B2 | 8/2006 | Takase et al. | |
| 7,161,842 B2 | 1/2007 | Park | |
| 7,193,897 B2 | 3/2007 | Lee | |
| 8,237,212 B2 | 8/2012 | Lee et al. | |
| 8,378,407 B2 | 2/2013 | Audzeyeu et al. | |
| 2004/0156236 A1 * | 8/2004 | Masuoka .............. | H01L 27/115 365/185.17 |

(Continued)

FOREIGN PATENT DOCUMENTS

KR       1020120069115 A       6/2012

*Primary Examiner* — Son Dinh
*Assistant Examiner* — Uyen B Tran
(74) *Attorney, Agent, or Firm* — Myers Bigel & Sibley, P.A.

(57) ABSTRACT

A logic embedded nonvolatile memory device is provided which includes a first erase gate line for erasing a plurality of first memory cells; a second erase gate line electrically separated from the first erase gate line and for erasing a plurality of second memory cells; a global erase gate line supplied with an erase voltage; and an erase gate selection switch formed between the first memory cells and the second memory cells, wherein the erase gate selection switch connects the global erase gate line to the first erase gate line or the second erase gate line according to an erase control signal.

19 Claims, 13 Drawing Sheets

(56) References Cited

U.S. PATENT DOCUMENTS

| | | | |
|---|---|---|---|
| 2008/0123416 A1* | 5/2008 | Chih | G11C 16/0433 365/185.05 |
| 2008/0205144 A1* | 8/2008 | Yamamoto | G11C 16/0441 365/185.05 |
| 2010/0290292 A1* | 11/2010 | Tanizaki | G11C 16/10 365/185.22 |
| 2011/0171797 A1* | 7/2011 | Om | H01L 27/115 438/257 |
| 2012/0195123 A1 | 8/2012 | Lee | |

* cited by examiner

Fig. 12

| Mode | | WL | CGL | SL | BL | GEGL | ECL |
|---|---|---|---|---|---|---|---|
| Program | Select | 0.7V | 9.0V | 4.5V | ~0.3V | 4.5V | 0V |
| | Unselect | 0V | 0V | VDD/3 | VDD | 0V | 0V |
| Read | Select | VDD | 1.5V | 0V | ~0.4V | 0V | 0V |
| | Unselect | 0V | 1.5V | 0V | 0V | 0V | 0V |
| Erase | Select | 0V | 0V | 0V | 0V | 11V | 0V |
| | Unselect | 0V | VDD | 0V | 0V | 0V | 11V |

LOGIC EMBEDDED NONVOLATILE MEMORY DEVICE

CROSS-REFERENCE TO RELATED APPLICATION

This application claims priority under 35 U.S.C. §119 to Korean Patent Application No. 10-2013-0136400, filed Nov. 11, 2013 in the Korean Intellectual Property Office, the entire contents of which are hereby incorporated by reference.

BACKGROUND

The inventive concepts described herein relate to a semiconductor device, and more particularly, relate to a logic embedded nonvolatile memory semiconductor device.

A card system such as a smart card or a USIM (Universal Subscriber Identity Module) may be a chip that includes both a nonvolatile memory device and system logic. The nonvolatile memory device that is implemented on the same chip as the system logic may be referred to as a logic embedded flash memory. During fabrication, it is desirable that the logic embedded flash memory may be easily combined with the other system logic that is part of the card system.

For example, the logic embedded flash memory may be used as a code memory. The code data that is stored in the code memory may be frequently updated according to the operation of the card system. The amount of data that is changed when the code data is updated may be relatively small. However, the logic embedded flash memory may, in general, operate in an erase-after-write manner. Thus, each update of the code data may inevitably cause erase and program operations. Thus, even though only a small amount of data may need to be updated, a significant portion of the memory area may be erased as part of the update.

SUMMARY

According to embodiments of the inventive concepts, logic embedded flash memory devices are provided that may be capable of reducing a capacity of an erase unit efficiently through a change in the manner in which the device is driven and/or through a change in the control logic.

One aspect of embodiments of the inventive concepts is directed to providing a logic embedded nonvolatile memory device that includes a first erase gate line that is configured to erase a plurality of first memory cells; a second erase gate line that is configured to erase a plurality of second memory cells; a global erase gate line that is configured to receive an erase voltage from a voltage source; and an erase gate selection switch that is connected between the global erase gate line and the first and second gate lines, wherein the erase gate selection switch is configured to connect the global erase gate line to only one of the first erase gate line or the second erase gate line in response to an erase control signal having a first value.

Another aspect of embodiments of the inventive concepts is directed to providing a nonvolatile memory device comprising a cell array including a first erase unit having a plurality of first memory cells that share a first erase gate line, a second erase unit having a plurality of second cells that share a second erase gate line, the plurality of first memory cells and the plurality of second memory cells are part of a single row of memory cells, and an erase gate selection switch that is configured to selectively connect a global erase gate line to the first erase gate line and the second erase gate line; a row decoder that is configured to provide an erase voltage to the global erase gate line in response to a row address; and a column decoder that is configured to control the erase gate selection switch in response to a column address to select at least one of the first erase unit and the second erase unit.

Pursuant to still another aspect of embodiments of the inventive concepts, a nonvolatile memory device is provided that comprises first memory cells that are part of a first row and that are connected to a first erase gate line; second memory cells that are part of the first row that are connected to a second erase gate line; third memory cells that are part of a second row that is different from the first row and that are connected to a third erase gate line; fourth memory cells that are part of the second row and that are connected to a fourth erase gate line; a first erase gate selection switch that is configured to selectively connect a first global erase gate line to the first erase gate line; a second erase gate selection switch that is configured to selectively connect the first global erase gate line to the second erase gate line; a third erase gate selection switch that is configured to selectively connect a second global erase gate line to the third erase gate line; and a fourth erase gate selection switch that is configured to selectively connect the second global erase gate line to the fourth erase gate line.

According to still further aspects of the inventive concepts, a logic embedded nonvolatile memory device is provided that includes a cell array that includes a plurality of first memory cells that are connected to a first word line; a global erase gate line that is configured to receive an erase voltage; a first erase gate selection switch that is configured to be controlled by a first erase control signal; a first sub-erase gate line that is connected to the global erase gate line via the first erase gate selection switch and that is connected to a first subset of the plurality of first memory cells; a second erase gate selection switch that is configured to be controlled by a second erase control signal; and a second sub-erase gate line that is connected to the global erase gate line via the second erase gate selection switch and that is connected to a second subset of the plurality of first memory cells.

BRIEF DESCRIPTION OF THE FIGURES

The inventive concepts will become apparent from the following description with reference to the following figures. Herein, like reference numerals refer to like parts throughout the figures and description unless otherwise specified herein.

FIG. 12 is a table showing bias conditions of operation modes of a nonvolatile memory device according to an embodiment of the inventive concepts;

DETAILED DESCRIPTION

Figure 1:
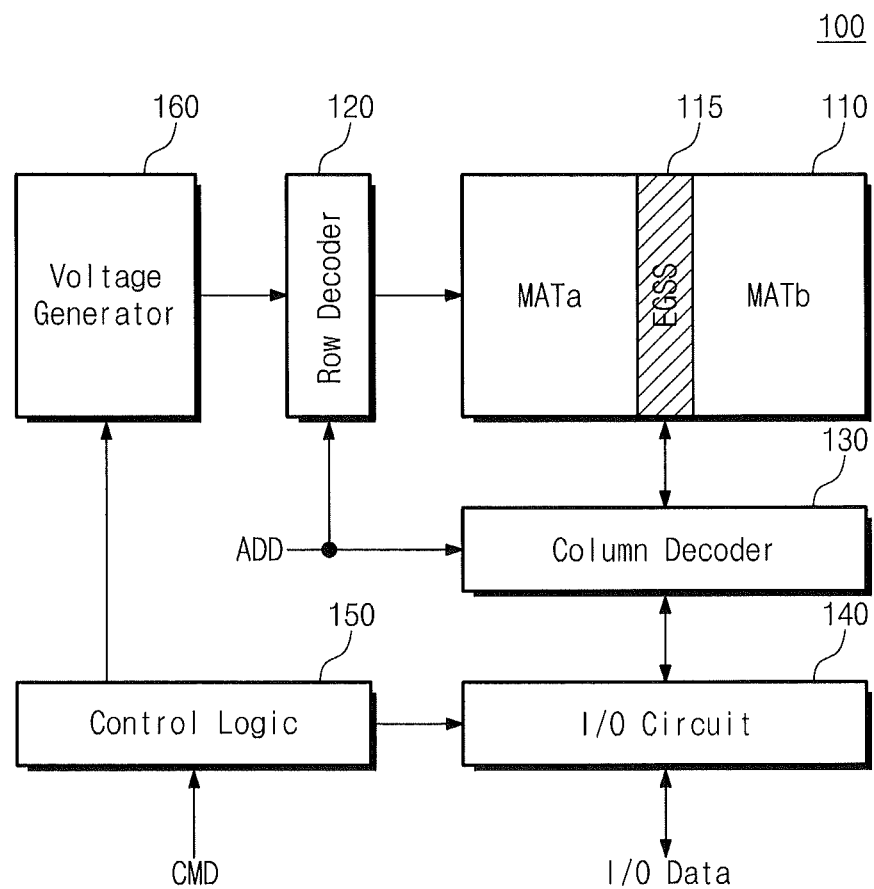
FIG. 1 is a block diagram schematically illustrating a nonvolatile memory device according to an embodiment of the inventive concepts.

Embodiments of the inventive concepts will now be described in detail with reference to the accompanying drawings. The inventive concepts, however, may be embodied in many different forms, and should not be construed as being limited to the embodiments illustrated herein. Rather, these embodiments are provided as examples so that this disclosure will be thorough and complete, and will fully convey the inventive concepts to those skilled in the art. Accordingly, known processes, elements, and techniques are not described with respect to some of the embodiments of the inventive concepts. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concepts.

Spatially relative terms, such as "beneath", "below", "lower", "under", "above", "upper" and the like, may be used herein for ease of description to describe one element or feature's relationship to another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element is referred to as being "on", "connected to", "coupled to", or "adjacent to" another element, it can be directly on, connected, coupled, or adjacent to the other element, or intervening elements may be present. In contrast, when an element is referred to as being "directly on," "directly connected to", "directly coupled to", or "immediately adjacent to" another element, there are no intervening elements present.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Below, a semiconductor device or a semiconductor chip may be used as an example of a unit for describing the spirit and scope of the inventive concepts. However, those skilled in the art may easily understand other applications based on the contents disclosed herein. Thus it will be appreciated that the inventive concepts may be implemented in further embodiments beyond those that are expressly pictured and/or described herein and may also be applied in other applications. Further, it will be apparent to those skilled in the art that various changes and modifications may be made without departing from the spirit and scope of the inventive concepts. Therefore, it should be understood that the embodiments disclosed herein are not limiting, but illustrative.

The terms 'selected line' and 'selected lines' may be used to indicate a line or lines from among a plurality of lines that are associated with a memory cell or memory cells corresponding to a program or erase target. The terms 'unselected line' or 'unselected lines' may be used to indicate a line or lines from among the plurality of lines that are associated with a memory cell or memory cells corresponding to a program-inhibit or erase-inhibit target.

The terms 'selected memory cell' or 'selected memory cells' may be used to indicate a memory cell or memory cells from a plurality of memory cells that correspond to a program or erase target. The terms 'unselected memory cell' or 'unselected memory cells' may be used to indicate a remaining memory cell or remaining memory cells from the plurality of memory cells other than the selected memory cell or the selected memory cells.

FIG. 1 is a block diagram schematically illustrating a nonvolatile memory device 100 according to an embodiment of the inventive concepts. Referring to FIG. 1, the nonvolatile memory device 100 may include a cell array 110, a row decoder 120, a column decoder 130, an input/output (I/O) circuit 140, control logic 150, and a voltage generator 160. The nonvolatile memory device 100 may be a logic embedded flash memory.

The cell array 110 may include a plurality of memory cells, each of which stores one or more data bits. Each of the memory cells may be a single level cell (SLC) storing 1-bit data or a multi-level cell (MLC) storing two or more data bits.

Each of the memory cells may include a cell transistor CT and a selection transistor ST. Two different memory cells that are adjacent to each other in a row direction may share a word line. Two different memory cells that are adjacent to each other in a column direction may share an erase gate. With this arrangement, memory cells corresponding to two word lines may be simultaneously erased during an erase operation.

During an erase operation, injected charges that are stored in a memory cell may migrate to an erase gate via F-N tunneling. For example, when a high voltage is applied to the erase gate and a voltage of 0V is applied to a word line WL, a control gate CG, and a source line SL, injected charges that are stored in a floating gate FG may migrate to the erase gate EG. The manner of erasing memory cells may not be limited to the F-N tunneling. For example, it is understood that hot hole injection may be used to erase memory cells.

The cell array 110 may include an erase gate selection switch 115. The erase gate selection switch 115 may select some or all of the memory cells in a selected row during an erase operation. That is, the erase gate selection switch 115 may select an erase unit of memory cells in a selected row. Here, a row selected for erasing (i.e., a selected row) may correspond to two word lines. In other embodiments, a row may correspond to a different number of word lines (e.g., a single word line).

Two word lines may be selected for erasing. If the number of bit lines is 2048, the number of memory cells corresponding to two word lines may be 4096. When an erase gate is activated during an erase operation, 4096 memory cells may be erased. If each memory cell stores a single data bit, a total of 512 bytes of data may thus be erased. If a row is divided into two erase units by the erase gate selection switch 115, 2048 memory cells may be erased through one erase operation. That is, if the erase gate selection switch 115 of the inventive concepts is used, an erase operation may be performed under a condition where a selected row may be divided, for example, into right and left sides. The structure and the operation of the erase gate selection switches 115 according to embodiments of the present invention will be more fully described with reference to accompanying drawings.

In the specific embodiment depicted in FIG. 1, the cell array 110 is divided into left and right portions that are designated MATa and MATb by the erase gate selection switch 115. That is, during an erase operation, one or all of the erase units belonging to the same row and respectively included in the mats MATa and MATb may be selected. Selection of the erase units may be made by the erase gate selection switch 115. The erase gate selection switch 115 may enable the size of minimum erase unit to be reduced without use of a separate row decoder.

The row decoder 120 may be connected to the cell array 110 through a word line WL, a control gate line CGL, and a global erase gate line GEGL. The row decoder 120 may select a word line WL, a control gate line CGL, and a global erase gate line GEGL corresponding to a selected memory cell in response to an address ADD. The row decoder 120 may transfer various voltages from the voltage generator 160 to the selected lines WL, CGL, and CEGL.

The column decoder 130 may select bit lines of memory cells in response to the address ADD. During a data writing operation, data input from an external device through a de-multiplexer DEMUX that is included in the column decoder 130 may be written by a row unit of the cell array 110. During a read operation, a row unit of data may be selected as a data size of the input/output circuit 140 by a multiplexer MUX included in the column decoder 130. The column decoder 130 of the inventive concepts may select a part or all of erase units corresponding to a selected row based on erase gate selection information included in the address ADD during an erasing operation. That is, the column decoder 130 may control the erase gate selection switch 115 in response to the address ADD.

The input/output circuit 140 may be connected to the cell array 110 through bit lines. The input/output circuit 140 may receive data from an external device and may store the received data in the cell array 110. The input/output circuit 140 may also read data stored in the cell array 110 and may transfer the read data to the external device. For example, the input/output circuit 140 may include components such as a write driver, a sense amplifier, a data buffer, etc.

The control logic 150 may control the overall operation of the nonvolatile memory device 100 in response to a command CMD. The control logic 150 may control the operation of the nonvolatile memory device 100 using erasing techniques according to embodiments of the inventive concepts. For example, in response to an erasing command, the control logic 150 may control the voltage generator 160 to generate the voltages required for the erasing operation. The control logic 150 may control the input/output circuit 140 to bias bit lines during the erasing operation. If a write or read command is provided, the control logic 150 may control the voltage generator 160 and the input/output circuit 140 to perform an operation corresponding to the input command.

The voltage generator 160 may generate DC voltages that are provided to the word lines WL, control gate lines CGL, and global erase gate lines GEGL under the control of the control logic 150. The voltage levels that the voltage generator 160 may generate according to each operation mode will be more fully described below.

According to embodiments of the inventive concepts, it is possible to change a minimum erase unit of memory cells. It will also be understood that a plurality of the erase gate selection switches 115 may be used.

Figure 2:
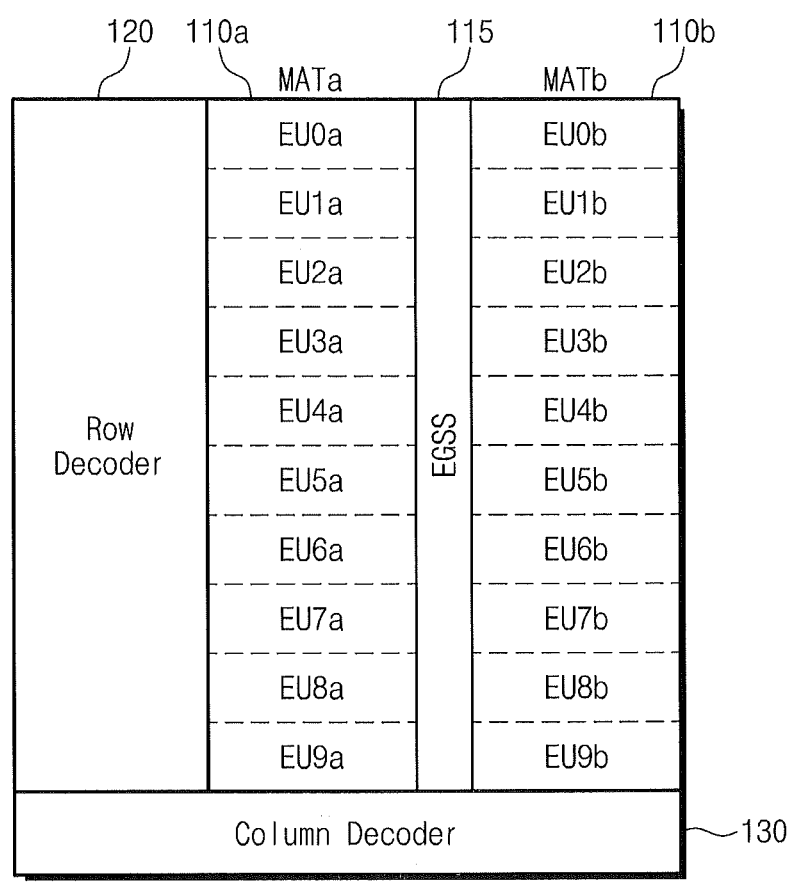
FIG. 2 is a block diagram schematically illustrating an erase unit selection structure according to an embodiment of the inventive concepts.

FIG. 2 is a block diagram schematically illustrating an erase unit selection structure according to an embodiment of the inventive concepts. In the specific embodiment depicted in FIG. 2, the cell array 110 is divided into two mats MATa and MATb by a single erase gate selection switch 115. It will be appreciated, however, that the inventive concepts are not limited to this configuration. For example, it will be understood that in further embodiments the cell array 110 may be divided into three or more mats by the erase gate selection switch 115.

A memory area of the first mat MATa may be divided into a plurality of erase units EU0a to EU9a, each of which is connected to two word lines and two control gate lines CGL. For example, the erase unit EU0a may be connected to two word lines WL0 and WL1 and two control gate lines CGL0 and CGL1. The erase unit EU0a may be simultaneously erased by a sub erase gate line SEGL1a. Each of the erase units EU1a to EU9a may have a structure similar or identical to the structure of the erase unit EU0a.

A memory area of the second mat MATb may be divided into a plurality of erase units EU0b to EU9b, each of which is connected to two word lines and two control gate lines CGL. For example, the erase unit EU0b may be connected to two word lines WL0 and WL1 and two control gate lines CGL0 and CGL1. The erase unit EU0b may be simultaneously erased by a sub erase gate line SEGL1b. Each of the erase units EU1b to EU9b may have a structure similar or identical to the structure of the erase unit EU0b.

During a read operation, the same bias voltages may be provided to the erase units EU0a and EU0b that are in the same row. However, during an erase operation, sub erase gate lines SEGL1a and SEGL1b may be selectively connected to a global erase gate line GEGL by the erase gate selection switch 115. The erase gate selection switch 115 may also be controlled so that the sub erase gate lines SEGL1a and SEGL1b are both connected to the global erase gate line GEGL.

During an erase operation, the row decoder 120 may select a row to be erased based on a row address, and may provide an erase voltage to a global erase gate line GEGL of the selected row. At the same time, a column decoder 130 may connect a sub erase gate line SEGL, corresponding to one or each of the erase units of rows that are selected for erasing, to the global erase gate line GEOL. Thus, erase units EUja and EUjb (j indicating a particular row) may be easily selected by an address provided to the row decoder 120 and the column decoder 130.

Figure 3:
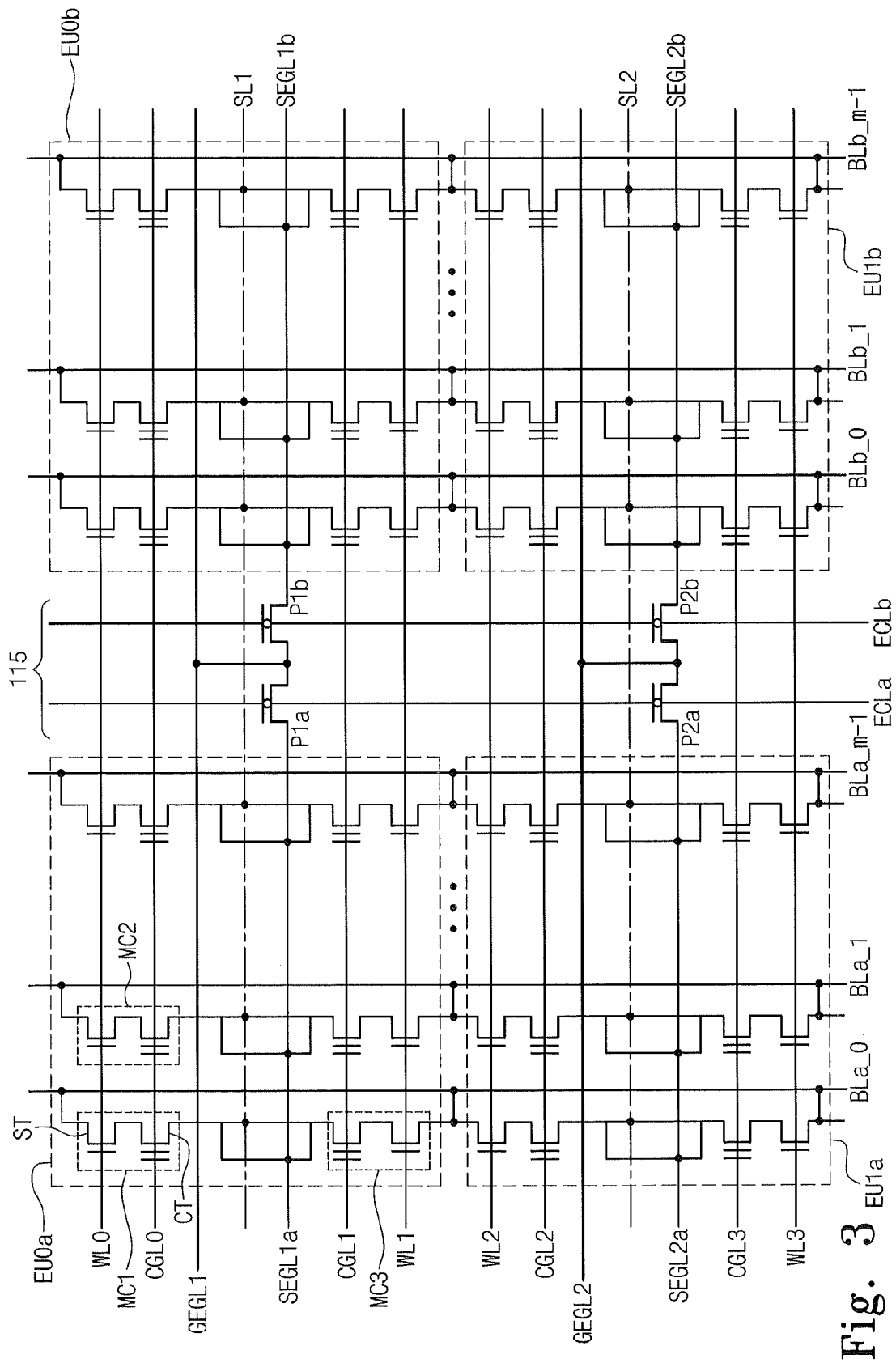
FIG. 3 is a circuit diagram schematically illustrating a structure of several of the erase units shown in FIG. 2.

FIG. 3 is a circuit diagram schematically illustrating a structure of each erase unit shown in FIG. 2 according to embodiments of the inventive concepts. Referring to FIG. 3, a cell array 110 may include a plurality of erase units EU0a to EU9a and EU0b to EU9b, each of which is capable of being selected by an erase gate selection switch 115 during an erasing operation. For ease of description and to simplify the drawings, only erase units EU0a, EU0b, EU1a, and EU1b are illustrated in FIG. 3.

As shown in FIG. 3, the erase unit EU0a may include a plurality of memory cells that are connected to bit lines BLa_0 to BLa_m−1. The memory cells included in the erase unit EU0a may be connected to one of word lines WL0 and WL1. The memory cells included in the erase unit EU0a may be erased when a high-voltage switch P1a included in the erase gate selection switch 115 is turned on at an erasing operation. That is, an erase voltage (e.g., 11V) supplied to a global erase gate line GEGL1 may be selectively supplied to a sub erase gate line SEGL1a based on whether the high-voltage switch P1a is turned on.

The erase unit EU0b and the erase unit EU0a may share the global erase gate line GEGL1. The erase unit EU0b may include a plurality of memory cells that are connected to bit lines BLb_0 to BLb_m−1. The memory cells included in the erase unit EU0b may also be connected to one of the word lines WL0 and WL1. The memory cells included in the erase unit EU0b may be erased when a high-voltage switch P1b included in the erase gate selection switch 115 is turned on at an erasing operation. That is, an erase voltage (e.g., 11V) supplied to the global erase gate line GEGL1 may be selectively supplied to a sub erase gate line SEGL1b based on whether the high-voltage switch P1b is turned on.

The erase units EU1a and EU1b may be configured the same as the erase units EU0a and EU0b except that they are connected to different word lines (namely word lines WL2 and WL3) and to a different global erase gate line GEGL2.

During an erasing operation, an erase voltage (e.g., 11V) supplied to the global erase gate line GEGL2 may be selectively supplied to sub erase gate lines SEGL2a and SEGL2b according to whether the high-voltage switches P2a and P2b are turned on.

The erase gate selection switch 115 for connecting sub erase gate lines corresponding to each erase unit to a global erase gate line may be formed, for example, of high-voltage switches that are disposed at left and right sides with respect to two rows. The high-voltage switches P2a and P2a of the erase gate selection switch 115 may be connected to an erase control line ECLa. The high-voltage switches P1a and P2a may be turned on or off by a voltage of the erase control line ECLa that is provided by the column decoder 130. The high-voltage switches P1b and P2b may be connected to an erase control line ECLb. The high-voltage switches P1b and P2b may be turned on or off by a voltage of the erase control line ECLb that is also provided by the column decoder 130.

The voltages carried by the erase control lines ECLa and ECLb may comprise an erase control signal. In some embodiments, the erase control signal may have a first value in which the high-voltage switches Pa1 and P2a are turned on and the high-voltage switches P1b and P2B are turned off, a second value in which the high voltage switches Pa1 and P2a are turned off and the high-voltage switches P1b and P213 are turned on, a third value in which the high-voltage switches Pa1 and P2a are turned on and the high-voltage switches P1b and P2B are turned on, and a fourth value in which the high voltage switches Pa1 and P2a are turned off and the high-voltage switches P1b and P2B are turned off. It will be appreciated, however, that erase control signals having different values may be used.

Each memory cell may include a selection transistor ST and a cell transistor CT. A gate of the selection transistor ST may be connected to a word line WL, and a control gate CG of the cell transistor CT may be connected to the control gate line CGL. Memory cells included in the same erase unit may share a sub erase gate line SEGL. Erase units adjacent in a row direction (word line direction) may share a global erase gate line GEGL. The sub erase gate line SEGL and the global erase gate line GEGL may be electrically connected through the erase gate selection switch 115.

During an erasing operation, the sub erase gate line SEGL may collect electrons that are stored in a floating gate of a cell transistor of a memory cell that is adjacent to the sub erase gate line SEGL. Memory cells connected through the same word line and the same control gate line CGL may be managed by a writing/read unit at a program or read operation. However, although memory cells are connected to the same word line, during an erasing operation the erase gate selection switch 115 may determine which of the memory cells that are connected to a particular word line are in fact selected and erased.

While the example embodiment depicted in FIG. 3 includes two high-voltage switches that are located side-by-side in the middle of each row and share a common source, it will be appreciated that the inventive concepts are not limited to this configuration. For example, in other embodiments, the two high voltage switches may be spaced apart from each other and may divide each row into three sub-erase units. In another embodiment, three high-voltage switches may be provided in each row that divide the row into four sub-erase units. Numerous other embodiments are possible.

Figure 4:
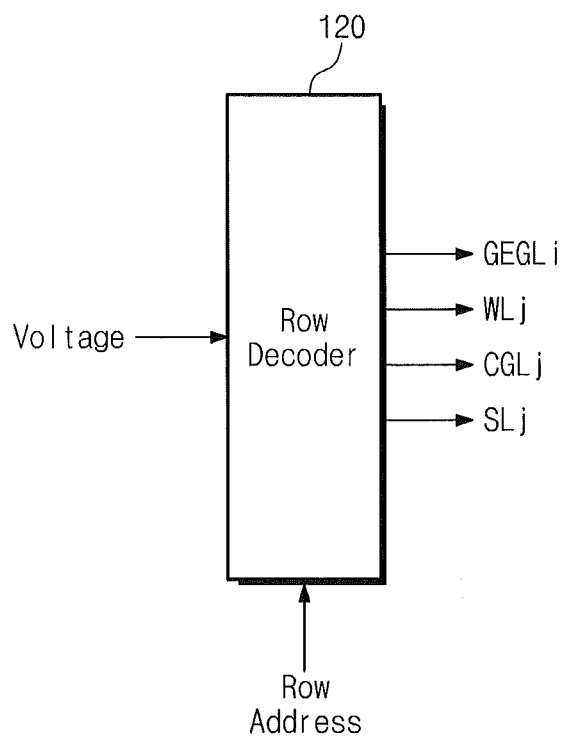
FIG. 4 is a block diagram schematically illustrating the inputs and outputs of the row decoder of FIG. 1.

FIG. 4 is a block diagram schematically illustrating input and output signals of the row decoder 120 shown in FIG. 1. As shown in FIG. 4, the row decoder 120 may provide various voltage levels that are received from a voltage generator 160 to a cell array 110 based on a row address.

The row decoder 120 may select a word line WL, a control gate line CGL, a source line SL, and a global erase gate line GEGL according to an input row address. The row decoder 120 may provide the selected lines WL, CGL, SL, and GEGL with appropriate voltages for erasing memory cells. In addition, during the erasing operation, the row decoder 120 may provide an erase-inhibit bias to unselected lines WL, CGL, SL, and GEGL.

During program and read operations, the row decoder 120 may provide selected lines WL, CGL, and SL with a bias corresponding to each operation mode. In particular, during program and read operations, the row decoder 120 may provide a ground voltage (e.g., 0V) to the global erase gate line GEGL. Example bias voltages provided at each of program, read, and erasing modes are described with reference to FIG. 12.

With the row decoder 120 of the inventive concepts, a voltage provided to a general erase gate line may be transferred to a global erase gate line GEGL of the inventive concepts. Thus, conventional row decoders may be used in the semiconductor memory devices according to embodiments of the inventive concepts, yet the benefit of a reduction in the size of the erase unit may still be achieved.

Figure 5:
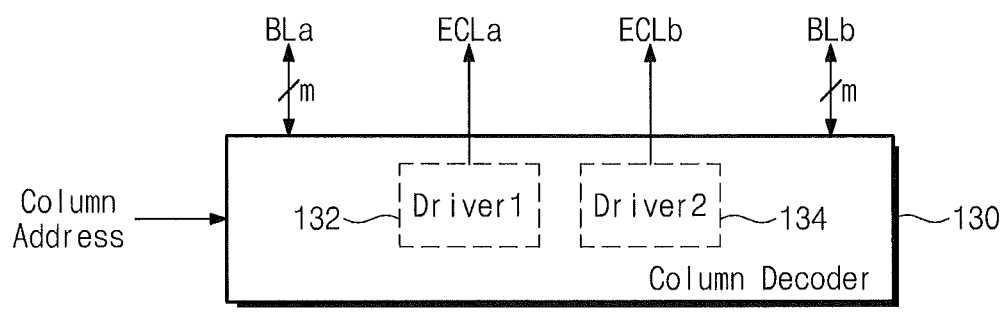
FIG. 5 is a block diagram schematically illustrating the column decoder of FIG. 1.

FIG. 5 is a block diagram schematically illustrating the column decoder 130 shown in FIG. 1. As shown in FIG. 5, the column decoder 130 may control the bit lines BLa and BLb and the erase control line ECLa and ECLb in response to a column address.

The column decoder 130 may select bit lines at a program or read operation. At this time, the column decoder 130 may control the erase control lines ECLa and ECLb. That is, at the program or read operation, the column decoder 130 may control an erase gate line selection switch (EGSS) 115 such that some or all of the sub erase gate lines SEGL in a selected row are connected to a global erase gate line GEGL.

Thus, for example, in an exemplary embodiment in which the erase gate selection switch 115 comprises a PMOS transistor, a voltage of 0V may be provided to erase control lines ECLa and ECLb. On the other hand, in embodiments in which the erase gate selection switch 115 comprises an NMOS transistor, a voltage of 11V may be provided to the erase control lines ECLa and ECLb.

During an erasing operation, the column decoder 130 may select all or a subset of the erase units that are connected to a selected row. That is, at the erasing operation, the column decoder 130 may provide a voltage of 0V to bit lines BLa and BLb. However, the column decoder 130 may select erase units selected by a column address through the erase control lines ECLa and ECLb. That is, the column decoder 130 may select one or all of the erase units EUja and EUjb (j being a natural number) to be erased based on information that is included in the column address for selecting erase units.

The column decoder 130 may include drivers 132 and 134 that drive the erase control lines ECLa and ECLb, respectively. The column decoder 130 may activate at least one of the drivers 132 and 134 in response to a column address received at an erasing operation, so at least one of the erase control lines ECLa and ECLb may be activated. Thus, an erase unit may be easily selected using information in the column address.

In the event that an erase unit corresponds to a data capacity of 256 bytes, at an erasing operation, 256 or 512 bytes may be erased using the column address. The smaller the size of erase unit EU, the smaller the size of the minimum erase unit. In other words, the greater the number of erase control lines ECL, the smaller the size of minimum erase unit.

Figure 6:
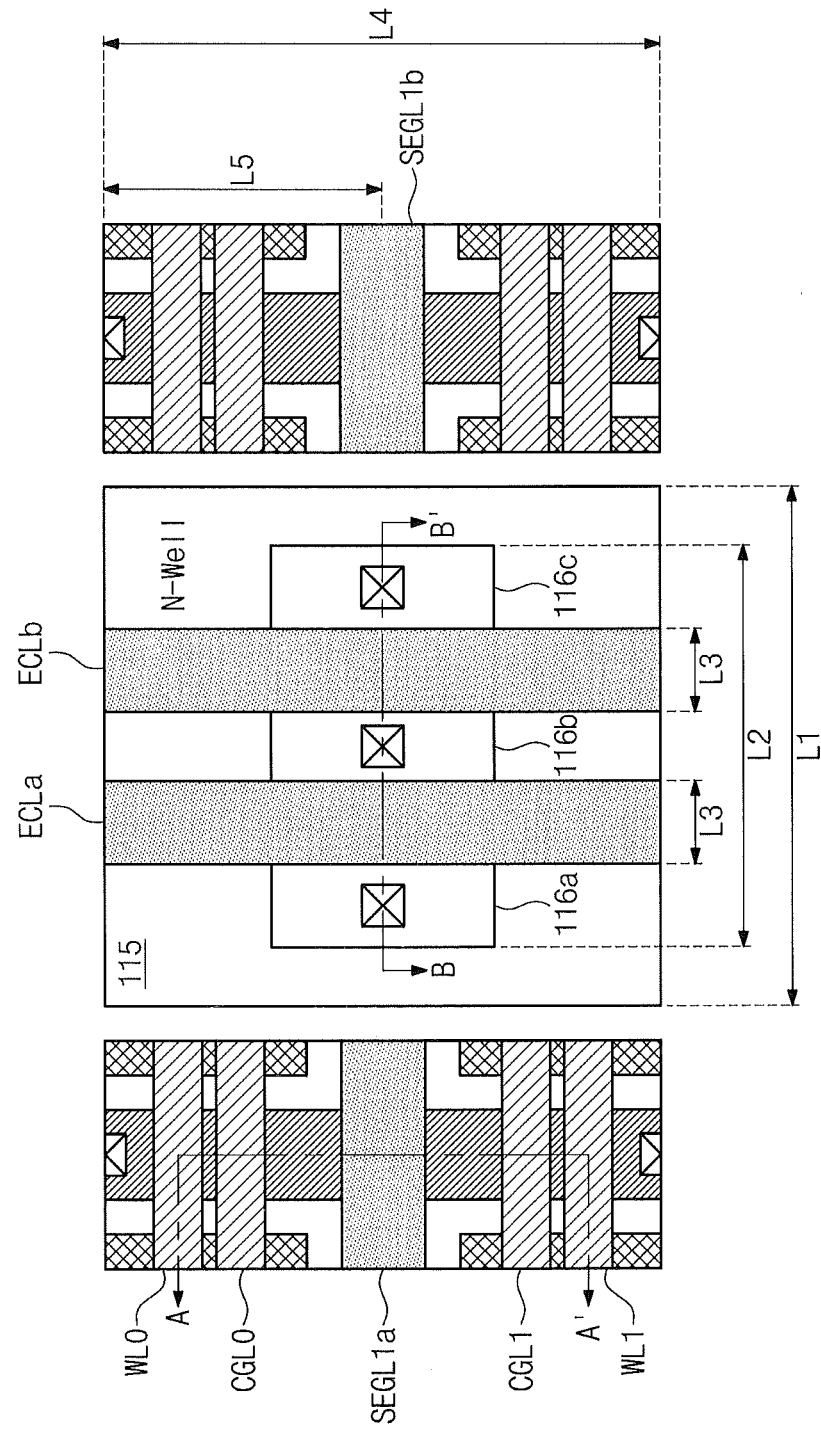
FIG. 6 is a diagram schematically illustrating a layout structure of an erase gate selection switch according to embodiments of the inventive concepts.

FIG. 6 is a diagram schematically illustrating a layout structure of an erase gate selection switch according to embodiments of the inventive concepts. Referring to FIG. 6, an erase gate selection switch 115 that comprises two high voltage transistors may be formed at a well N-Well.

Typically, the memory cells do not require a structure suitable for withstanding high voltages. The erase gate selection switch 115, however, may have a structure that is suitable for tolerating such high voltages. Memory cells of the cell array 110, for example, may be formed after a deep N-well and a pocket P-well are sequentially formed in a P-type substrate. On the other hand, the erase gate selection switch 115 may be formed at a high voltage N-type well that is formed in the P-type substrate. It will be appreciated, however, that embodiments of the inventive concept are not limited thereto.

As well known, to tolerate a high voltage (i.e., to prevent a punch through between a source and a drain), a channel of a high-voltage transistor may be longer than that of a low-voltage transistor. Also, to tolerate a high voltage (i.e., to tolerate a high potential difference between a gate and a drain/source), a gate oxide film of the high-voltage transistor may be thicker than that of the low-voltage transistor. In other words, a chip area of the high-voltage transistor may be wider than that of the low-voltage transistor. In addition, a constant space may be required between a high-voltage area and a cell array area according to a design rule to secure stable operation of the transistors.

To form the erase gate selection switch 115, a plurality of active areas 116a, 116b, and 116c may be formed at the N-type well. A P-type dopant may be injected into the well to form the active areas 116a, 116b, and 116c. The active areas 116a, 116b, and 116c may form sources 116a and 116c and a common source 116b of high-voltage switches that comprise the erase gate selection switch 115. The active area 116b may be electrically connected to a global erase gate line GEGL1 through, for example, a contact. The active area 116a may be electrically connected through a contact to polysilicon forming a sub erase gate line SEGL1a. The active area 116c may be electrically connected through a contact to polysilicon forming a sub erase gate line SEGL1b.

Erase control lines ECLa and ECLb forming gate terminals of the erase gate selection switch 115 may be formed on the active areas 116a, 116b, and 116c. The erase control lines ECLa and ECLb may extend in a column direction. The erase control lines ECLa and ECLb may be connected to the column decoder 130.

Arrangement of the erase gate selection switch 115 may be modified based on, for example, the size of the well area where the erase gate selection switch corresponding to a row is formed. In FIG. 6, an example embodiment is shown where a column-direction length of the erase gate selection switch 115 is shorter than or equal to a length L4 of a memory area corresponding to an erase unit. That is, if a length L4 of a memory area corresponding to two word lines WL0 and WL1 is longer than a column-direction length of a well of the erase gate selection switch 115, the erase gate selection switch 115 may be formed as illustrated in FIG. 6. However, in the event that a length L4 of a memory area corresponding to two word lines WL0 and WL1 is shorter than a column-direction length of the erase gate selection switch 115, the erase gate selection switch 115 may be formed to have, for example, a zigzag shape. This will be more fully described with reference to FIG. 13.

Figure 7:
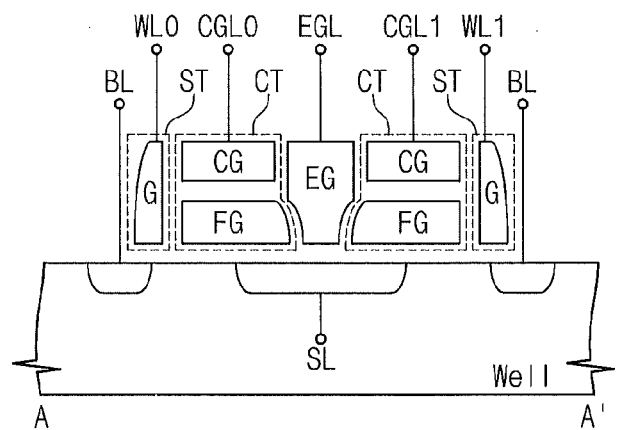
FIG. 7 is a cross-sectional view taken along a line A-A' of FIG. 6.

FIG. 7 is a cross-sectional view taken along a line A-A' of FIG. 6. As shown in FIG. 7, in the nonvolatile memory device 100 according to certain embodiments of the inventive concepts, an erase gate EG may be stacked on a well, and cell transistors (which are connected to the control gate lines CGL0 and CGL1) and selection transistors (which are connected to the word lines WL0 and WL1) may be symmetrically formed on either side of the erase gate EG. A lower portion of the well perpendicular to the erase gate EG may be doped with an N-type impurity and may be connected to a source line SL.

The cell transistors CT may be formed between the erase gate EG and a respective selection transistor ST. Each cell transistor CT may include a floating gate FG and a control gate CG that are sequentially stacked. The control gate CG of each cell transistor CT may be connected to a respective one of the control gate lines CGL. Each selection transistor ST may be formed at a side of a cell transistor and may include a gate G. The gate G of the selection transistor ST may correspond to a word line WL, and an area doped with an N-type impurity may be connected to a bit line BL.

Figure 8:
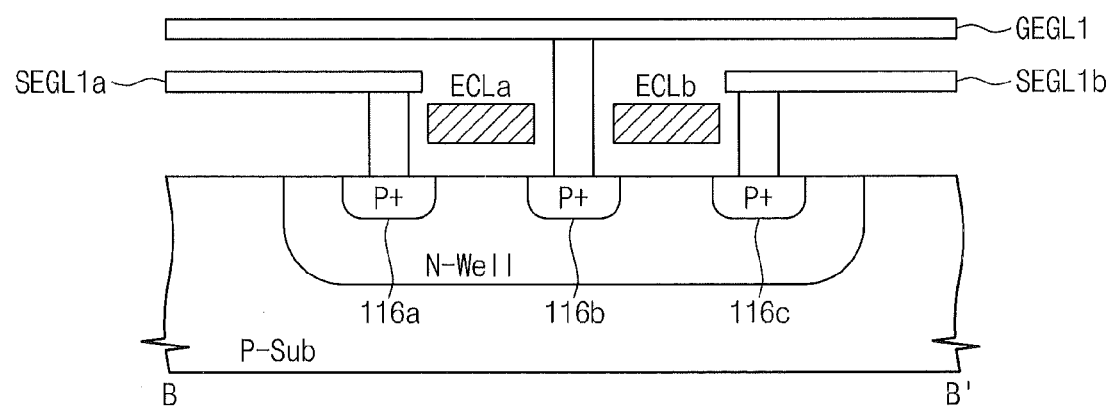
FIG. 8 is a cross-sectional view taken along a line B-B' of FIG. 6.

FIG. 8 is a cross-sectional view taken along a line B-B' of FIG. 6 that provides a cross-sectional view of the erase gate selection switch 115. In the embodiment depicted in FIG. 8, the high-voltage transistors that form the erase gate selection switch 115 are PMOS transistors.

An N-well may be formed in a substrate P-Sub to form the high-voltage switches. Active areas 116a, 116b, and 116c may be formed by injecting P-type dopants into the N-well. Erase control lines ECLa and ECLb may be formed over the active areas 116a, 116b, and 116c. The erase control lines ECLa and ECLb may extend in a column direction. The active area 116b may act as a common source of a high-voltage transistor. Thus, as shown in FIG. 8, the active area 116b may be connected through a contact to a global erase gate line GEGL. The active areas 116a and 116c may be connected to sub erase gate lines SEGL1a and SEGL1b, respectively through respective contacts.

A structure of the erase gate selection switch 115 may be modified in other embodiments. For example, the erase gate selection switch 115 is not limited to PMOS transistor implementations.

Figure 9:
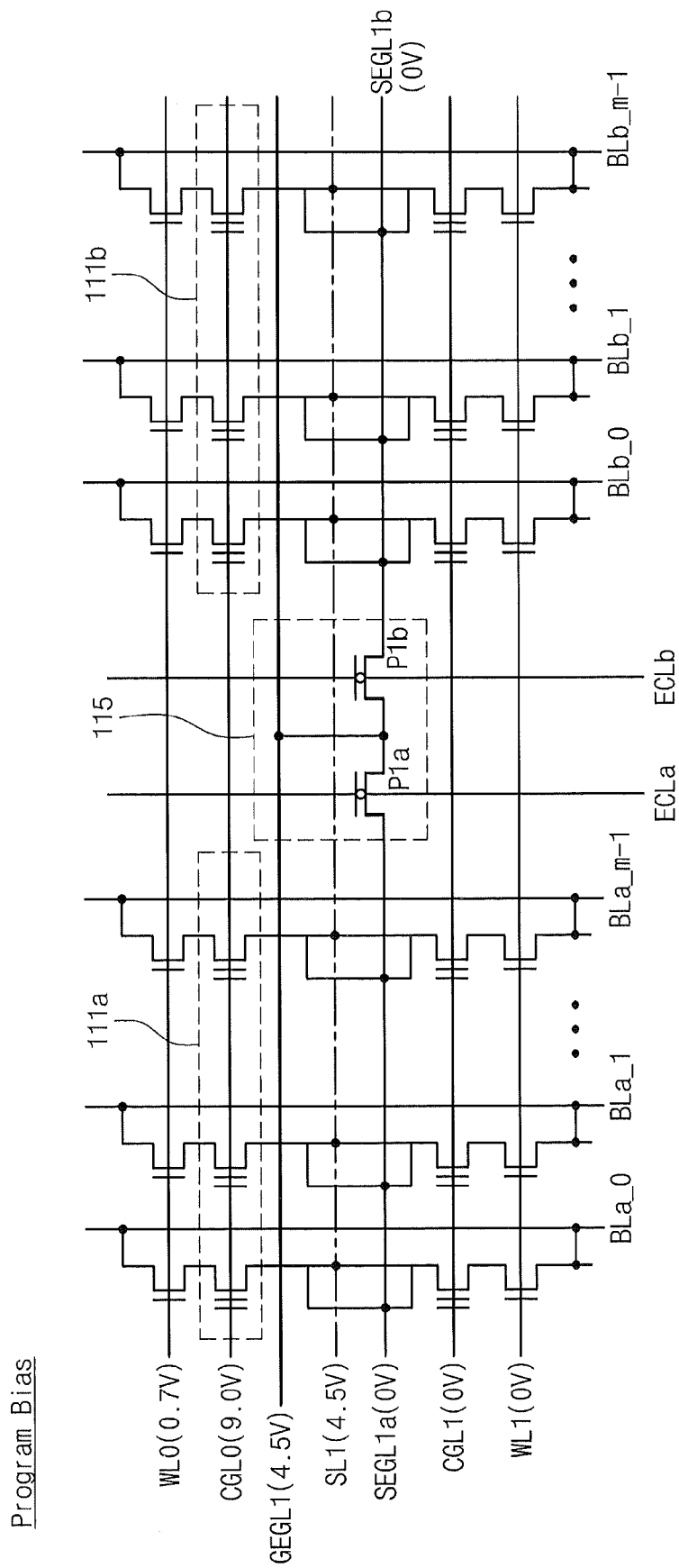
FIG. 9 is a circuit diagram schematically illustrating bias conditions for a program (write) operation for a non-volatile memory device according to an embodiment of the inventive concepts.

FIG. 9 is a circuit diagram schematically illustrating a bias condition of a program (i.e., write) operation according to an embodiment of the inventive concepts. Referring to FIG. 9, during the program operation, voltages of sub erase gate lines SEGL1a and SEGL1b may be maintained the same within a selected row. Here, it may be assumed that memory cells selected for programming are memory cells connected to a word line WL0. Also, it may be assumed that memory cells connected to a remaining word line (e.g., WL1) other than the word line WL0 are unselected memory cells.

At a program operation, a voltage of 4.5V may be provided to the global erase gate line GEGL1. Erase gate selection switches P1a and P1b of erase gate selection switch 115 may be turned on such that a voltage provided to the global erase gate line GEGL is transferred to sub erase gate lines SEGL1a and SEGL1b. In the depicted embodiment, voltages of 0V may be provided to the erase control lines ECLa and ECLb to turn on the erase gate selection switches P1a and P1b. Thus, at the program operation, a voltage of 4.5V may be provided to the sub erase gate lines SEGL1a and SEGL1b in a selected row when the erase gate selection switches 115 are turned on. A voltage of 4.5V may be provided to a source line SL1 corresponding to a memory cell to be programmed. A voltage of 9V may be applied to a control gate line CGL0 corresponding to the selected word line WL0.

It will be appreciated that voltage levels described herein may be exemplary, and voltages applied to the sub erase gate lines SEGL1a and SEGL1b and the source line SL1 may be variously adjusted. For example, voltages applied to the sub erase gate lines SEGL1a and SEGL1b and the source line SL1 may be set to a same or similar level such that a voltage difference is not generated. Also, a voltage of 0V may be applied to a word line WL1, a control gate line CGL1, an erase gate line (not shown), and a source line (not shown) corresponding to the unselected memory cells. A program-inhibit voltage (e.g., VDD) or a program voltage (e.g., 0V to 0.3V) may be provided to bit lines under the above-described bias conditions.

With the aforementioned bias conditions, a selection voltage (e.g., 0.7V) and a program voltage (e.g., 9V) may be applied to the word line WL0 and the control gate line CGL0 corresponding to the selected memory cell, respectively. Thus, a channel may be formed in the selected memory cell. Charges may be injected into a floating gate FG through the hot carrier injection (HCI), so the selected memory cell may be programmed. On the other hand, a channel may not be formed in the unselected memory cell, so charges may not be injected into a floating gate of the unselected memory cell.

The erase gate selection switch 115 may be turned on during a program operation. Thus, it is possible to write data in all of the memory cells included in a selected row.

Figure 10:
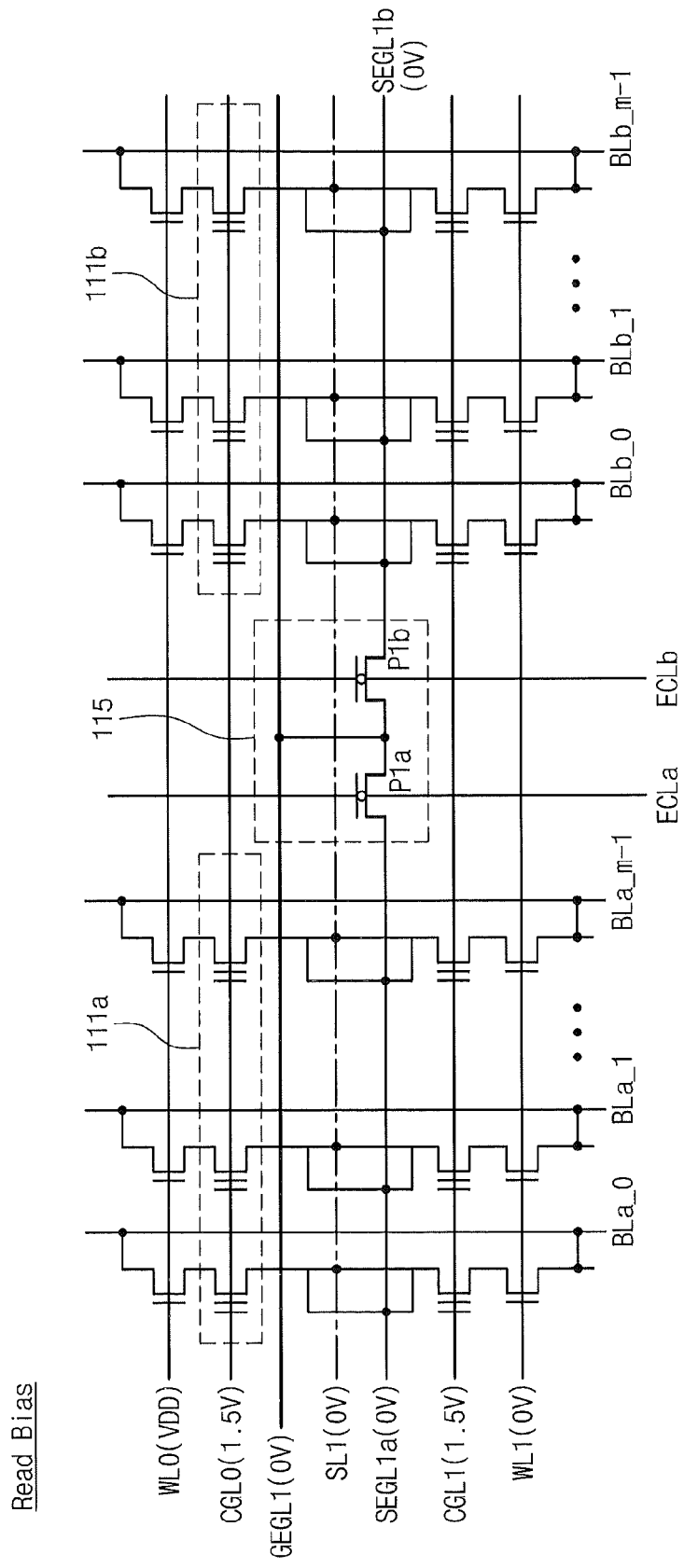
FIG. 10 is a circuit diagram schematically illustrating bias conditions for a read operation for a nonvolatile memory device according to an embodiment of the inventive concepts.

FIG. 10 is a circuit diagram schematically illustrating a read bias condition of a nonvolatile memory device according to embodiments of the inventive concepts. Referring to FIG. 10, voltages of sub erase gate lines SEGL1a and SEGL1b during a read operation may be maintained the same as those at a program operation. Here, it may be assumed that memory cells connected to a word line WL0 are memory cells selected for a read operation.

During a read operation, a voltage of 0V may be applied to a global erase gate line GEGL1. Erase gate selection switches P1a and P1b of erase gate selection switch 115 may be turned on such that the voltage provided to the global erase gate line GEGL1 is transferred to sub erase gate lines SEGL1a and SEGL1b. Thus, a voltage of 0V may be provided to erase control lines ECLa and ECLb to turn on the erase gate selection switches P1a and P1b. At the read operation, a voltage of 0V may be applied to sub erase gate lines SEGL1a and SEGL1b in a selected row when the erase gate selection switches p1a and p1b are turned on. A voltage of 0V may be provided to the sub erase gate lines SEGL1a and SEGL1b and a source line SL1 corresponding to a memory cell to be read.

During the read operation, a power supply voltage VDD may be provided to the selected word line WL0, so selection transistors connected to the word line WL0 may be turned on. A voltage of 1.5V may be applied to a control gate line CGL0 of a selected row. A voltage of 0V may be provided to an unselected word line WL1, so selection transistors controlled by the unselected word line WL1 may be turned off. A voltage of 1.5V may be applied to a control gate line CGL1 of an unselected row. However, since the selection transistors are turned off, a memory cell and a source line corresponding to the unselected row may be electrically isolated.

Bit lines BLa0 to BLa_m−1 and BLb_0 to BLb_m−1 may be pre-charged under the above-described bias conditions. Stored charges may be discharged into the source line SL1 according to whether cell transistors are programmed. The read operation may be accomplished by sensing currents flowing into the pre-charged bit lines.

Figure 11:
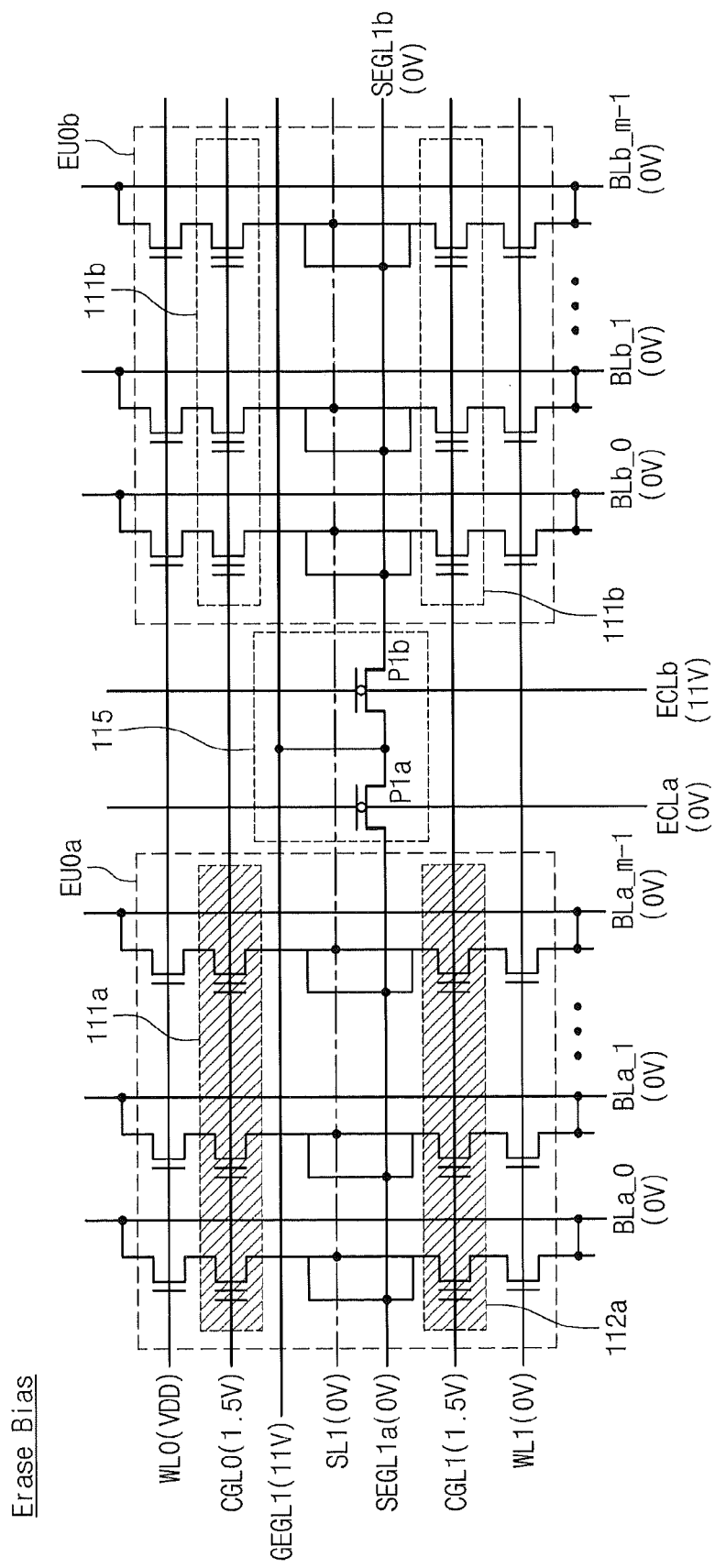
FIG. 11 is a circuit diagram schematically illustrating bias conditions for an erase operation of a nonvolatile memory device according to an embodiment of the inventive concepts.

FIG. 11 is a circuit diagram schematically illustrating bias conditions of an erase operation of a nonvolatile memory device according to embodiments of the inventive concepts. Referring to FIG. 11, one erase unit in a row selected for erasing may be erased according to a switching condition of an erase gate selection switch 115. Here, there may be described a bias condition for only erasing one erase unit EU0a of a group of two erase units EU0a and EU0b that are connected to word lines WL0 and WL1.

At an erase operation, memory cells connected to two word lines WL may be simultaneously erased by a structure of sub erase gate lines SEGLa and SEGLb shared by the two word lines WL. An erase voltage (e.g., 11V) may be provided to a global erase gate line GEGL1 corresponding to the word lines WL selected for erasing. The erase voltage may be transferred to a sub erase gate line SEGL1a to erase memory cells included in the erase unit EU0a. For this, a first transistor P1a of an erase gate selection switch 115 may be turned on to connect the global erase gate line GEGL1 to the sub erase gate line SEGL1a. A second transistor P1b of the erase gate selection switch 115 may be turned off in order to electrically isolate the sub erase gate line SEGL1b from the global erase gate line GEGL1. Control signals may be applied to the erase control lines ECLa and ECLb to turn on the first transistor P1a of the erase gate selection switch 115 and to turn off the second transistor P1b thereof. For example, a voltage of 0V may be applied to the erase control line ECLa, and a voltage of 11V may be applied to the erase control line ECLb.

As above described, at a bias condition for controlling the sub erase gate lines SEGL1a and SEGL1b, a voltage of 0V may be applied to word lines WL0 and WL1, control gate lines CGL0 and CGL1, a source line SL1, and bit lines BLa_0 to BLa_m−1 and BLb_0 to BLb_m−1. Although not shown, a voltage of 0V may also be applied to word lines WL2 to WLn corresponding to erase units not selected for erasing, and a power supply voltage VDD may be applied to control gate lines CGL2 to CGLn corresponding to erase units not selected for erasing.

With the aforementioned erase bias condition, charges injected into floating gates FG of cell transistors 111a and 112a included in the erase unit EU0a may migrate into channels of memory cells. In this case, charges injected into floating gates may be shifted into the sub erase gate line SEGL1a through the F-N tunneling generated by a potential difference between the floating gates FG and the sub erase gate line SEGL1a. That is, cell transistors in the erase unit EU0a may be erased.

However, charges injected into the floating gates of cell transistors 111b and 112b included in the erase unit EU0b may not be shifted into channels of memory cells, since the sub erase gate line SEGL1b is isolated from the global erase gate line GEGL1. Thus, since a potential difference between a floating gate FG of each memory cell in the erase unit EU0b and the sub erase gate line SEGL1b is not sufficient, F-N tunneling may not be generated. Thus, cell transistors 111b and 112b of erase unit EU0b are not erased.

There is described a method in which a subset of the memory cells in a selected row are erased according to the control of the erase gate selection switch 115. In addition, all memory cells in a selected row may be erased by driving the erase control lines ECLa and ECLb such that high-voltage switches P1a and P1b corresponding to the erase units EU0a and EU0b are both turned on.

FIG. 12 is a table showing bias conditions of operation modes of a nonvolatile memory device according to an embodiment of the inventive concepts. Referring to FIG. 12, there is shown bias conditions on selected memory cells and unselected memory cells at each operation mode.

As shown in FIG. 12, a voltage of 0.7V may be applied to a word line of a row selected at a program operation. A voltage supplied to the selected word line may be a voltage capable of turning on selection transistors of selected memory cells. Also, a voltage of 9.0V may be provided to a control gate line CGL of the selected row, and a voltage of 4.5V may be provided to a source line SL corresponding to the selected row. Under the above-described bias condition, a voltage of 4.5V may be applied to a global erase gate line GEGL corresponding to the selected row. A program bit line voltage (e.g., 0V to 0.3V) may be provided to a bit line of a cell to be programmed, and a program-inhibit voltage VDD may be applied to a bit line of a memory cell to be program-inhibited.

With the above-described bias conditions, a channel of the selected memory cell may be formed between the bit line BL and the source line SL. A current may flow between the source line SL and the bit line BL through the channel thus formed. At this time, hot electrons of the channel may be injected into a floating gate FG by the high voltage (e.g., 9.0V) applied to the control gate line CGL.

A voltage of 0V may be provided to a word line of an unselected row at the program mode. A voltage of 0V may be applied to a control gate line CGL of the unselected row. A voltage of VDD/3 may be provided to a source line SL corresponding to the unselected row. A voltage of 0V may be applied to a global erase gate line GEGL and to a sub erase gate line SEGL corresponding to the unselected row. A voltage of 0V may be provided to an erase control line ECL corresponding to the unselected row.

In a read mode, a power supply voltage VDD may be provided to a word line WL of a selected row, and a voltage of 0V may be applied to the unselected word lines. A voltage provided to the selected word line may be a voltage sufficient to turn on selection transistors of the selected memory cells. Also, a voltage of 1.5V may be supplied to control gate lines CGL of selected and unselected rows. A voltage of 0V may be applied to a source line SL of each of the selected and unselected rows. Under this condition, a voltage of 0V may be provided to a global erase gate line GEGL and a sub erase gate line SEGL of both the selected and unselected rows. Bit lines of memory cells that are to be read may be pre-charged and may be set up with a voltage of a particular level (e.g., about 0.4V). A voltage of the pre-charged bit line may be varied according to whether a cell transistor is programmed.

In an erase mode, a voltage of 0V may be applied to a word line of each of the selected and unselected rows. It may be all right to block selection transistors of memory cells to discharge charges of floating gates through the F-N tunneling. Also, a voltage of 0V may be provided to a control gate line CGL of a selected row. A power supply voltage VDD may be supplied to a control gate line CGL of an unselected row. A voltage of 0V may be provided to source lines SL of both selected and unselected rows. Also, a voltage of 0V may be supplied to bit lines of memory cells selected for erasing or to unselected memory cells.

A voltage of 11V may be provided to a global erase gate line GEGL of the selected row. A voltage of 0V may be only supplied to an erase control line ECL selected to provide a selected erase unit with a voltage provided to the global erase gate line GEGL. Here, the above-described voltages may be applied in embodiments where the erase gate selection switch 115 is a PMOS transistor. If the erase gate selection switch 115 is an NMOS transistor, a voltage of a selected erase control line ECL and a voltage of an unselected erase control line ECL may be reversed as compared with the above description.

When the above bias conditions are applied during an erase operation, only a subset of the erase units that are included in the same row may be selected through control of the erase control lines ECL. Thus, a nonvolatile memory device 100 according to embodiments of the inventive concepts may reduce the size of an erase minimum unit and may be easily implemented with minimum changes to existing device structures.

Figure 13:
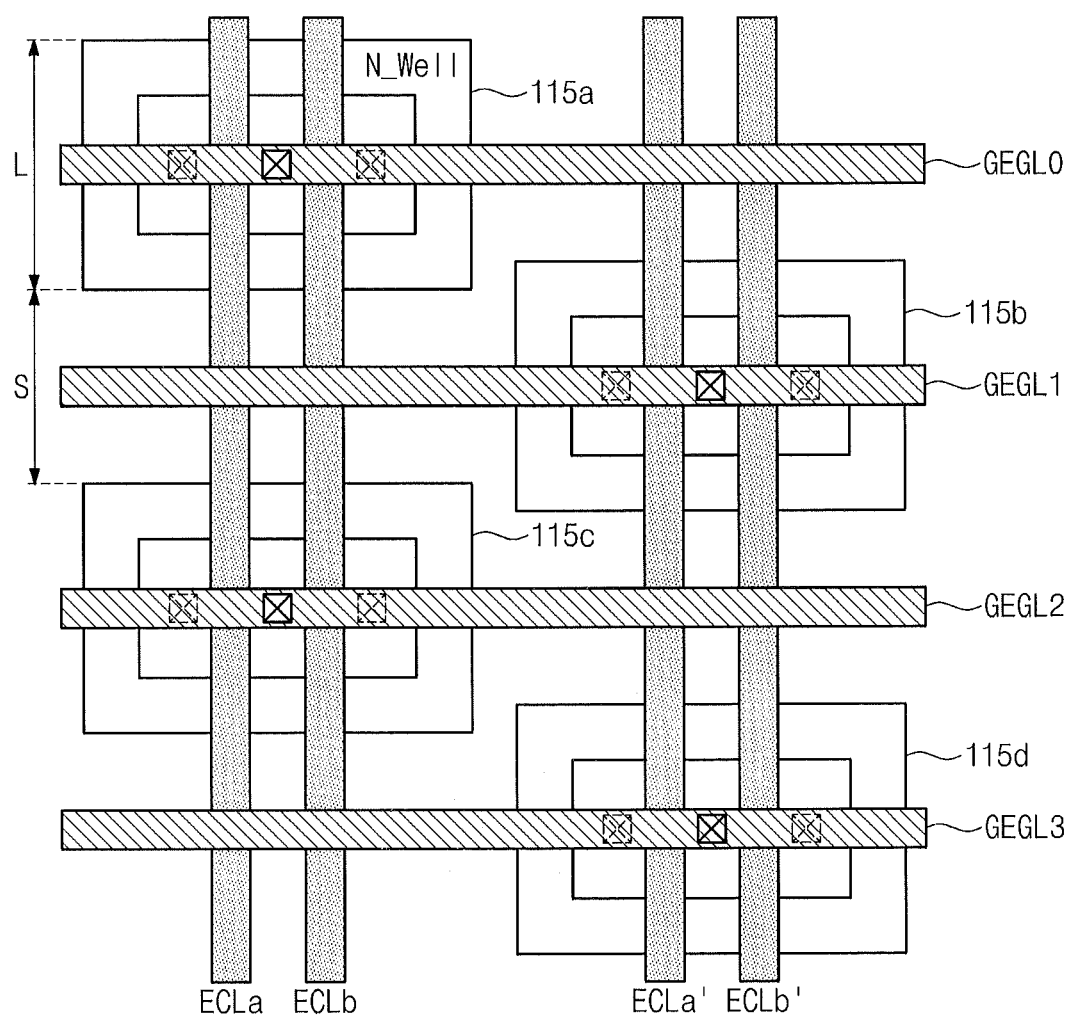
FIG. 13 is a diagram schematically illustrating an erase gate selection switch according to another embodiment of the inventive concepts.

FIG. 13 is a diagram schematically illustrating an erase gate selection switch according to another embodiment of the inventive concepts. Referring to FIG. 13, an erase gate selection switch 115 may be formed in a cell array to have a zigzag shape.

The erase gate selection switch 115 may comprise a plurality of high-voltage transistors. Thus, the size of the transistors included in the erase gate selection switch 115 may be different from the sizes of the memory cell transistors. A space between adjacent global erase gate lines (e.g., two of GEGL0 to GEGL3) arranged in the cell array may be insufficient to form the high-voltage transistors of the erase gate selection switch 115. That is, as illustrated in FIG. 13, a vertical-direction length L of an erase gate selection switch 115a may be greater than a space S between adjacent erase gate selection switches 115a and 115b. In this case, it may be difficult to form erase gate selection switches 115a, 115b, 115c, and 115d in the same column. Thus, the erase gate selection switches 115a, 115b, 115c, and 115d may be divided into two columns so as to be arranged in a zigzag shape.

If the erase gate selection switches 115a, 115b, 115c, and 115d are arranged in a zigzag shape, additional erase control lines may be provided. That is, the erase gate selection switches 115a and 115c may be controlled by erase control lines ECLa and ECLb, and the erase gate selection switches 115b and 115d may be controlled by erase control lines ECLa' and ECLb'. Here, the erase control lines ECLa and ECLa' may be electrically connected, and the erase control lines ECLb and ECLb' may be electrically connected.

Figure 14:
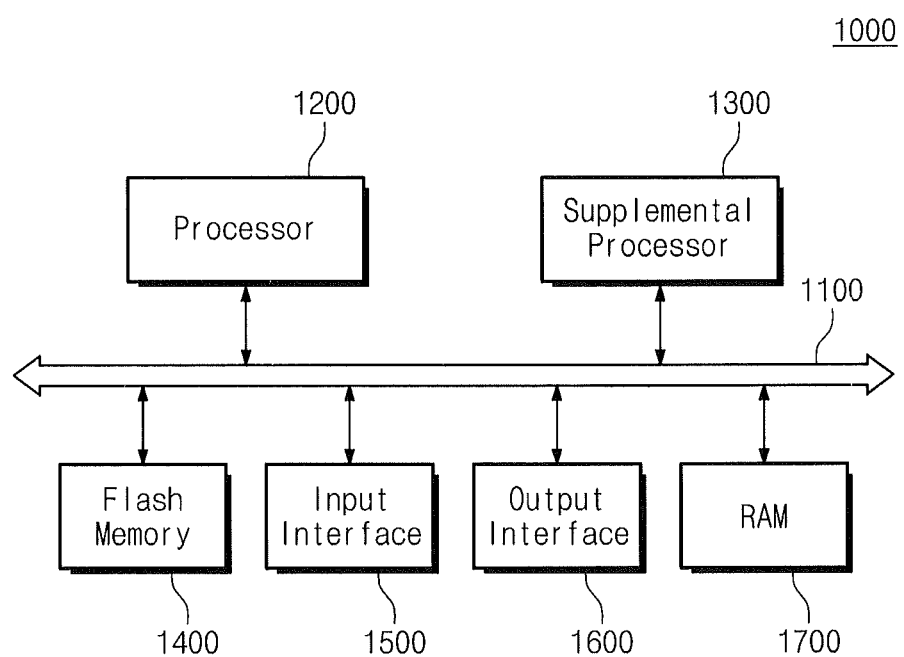
FIG. 14 is a block diagram schematically illustrating an embedded system according to an embodiment of the inventive concepts.

FIG. 14 is a block diagram schematically illustrating an embedded system 1000 according to an embodiment of the inventive concepts. Referring to FIG. 14, an embedded system 1000 may include a system bus 1100, a processor 1200, a supplemental processor 1300, an embedded flash memory 1400, an input interface 1500, an output interface 1600, and a RAM 1700.

The system bus 1100 may be configured to provide communications among components of the embedded system 1000. The processor 1200 may be configured to control an overall operation of the embedded system 1000. The processor 1200 may include a general-purpose processor or an application processor (AP). The supplemental processor 1300 may be configured to assist calculations of the processor 1200. The supplemental processor 1300 may include an image processor (or, codec), a sound processor (or, codec), a compression and de-compression processor (or, codec), a cipher and decipher processor (or, codec), and the like.

The embedded flash memory 1400 may include a nonvolatile memory device 100 described with reference to FIG. 1. The input interface 1500 may include devices that enable the embedded system to receive signals from an external device. The input interface 1500 may include at least one input device such as a button, a keyboard, a mouse, a microphone, a camera, a touch panel, a touch screen, or a wire-wireless receiver. The output interface 1600 may include devices that enable the embedded system 1000 to output signals to the external device. The output interface 1600 may include at least one output device such as a monitor, a lamp, a speaker, a printer, a motor, or a wire-wireless transmitter. The RAM 1700 may be used as a working memory of the embedded system 1000. The embedded flash memory 1400 may include a cell structure of the inventive concepts, so it may easily adjust an erase unit.

A semiconductor device according to the inventive concepts may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concepts have been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A logic embedded nonvolatile memory device comprising:
    a first erase gate line that is configured to erase a plurality of first memory cells;
    a second erase gate line that is configured to erase a plurality of second memory cells;
    a global erase gate line that is configured to receive an erase voltage from a voltage source; and
    an erase gate selection switch that is connected between the global erase gate line and the first and second erase gate lines,
    wherein the erase gate selection switch is configured to selectively electrically connect the global erase gate line to only one of the first erase gate line or the second erase gate line in response to an erase control signal having a first value, and
    wherein the first and second erase gate lines extend in parallel to the global erase gate line.

2. The logic embedded nonvolatile memory device of claim 1, wherein the erase gate selection switch comprises:
    first and second high-voltage switches that are provided in a high-voltage area that is between the first memory cells and the second memory cells.

3. The logic embedded nonvolatile memory device of claim 2, wherein the erase gate selection switch is in a well area that is separated from a well where the first memory cells or the second memory cells are formed.

4. The logic embedded nonvolatile memory device of claim 1, wherein the erase gate selection switch comprises:
    a first high-voltage transistor that is configured to connect the global erase gate line to the first erase gate line in response to the erase control signal having the first value; and a second high-voltage transistor that is configured to connect the global erase gate line to the second erase gate line in response to the erase control signal having a second value, and wherein channel lengths of the first and second high voltage transistors exceed channel lengths of the cell transistors of the first and second memory cells.

5. The logic embedded nonvolatile memory device of claim 4, wherein the first and second high-voltage transistors comprise a common source, and wherein the first and second high-voltage transistors are configured to connect the global erase gate line to the respective first and second erase gate lines in response to the erase control signal having a third value.

6. The logic embedded nonvolatile memory device of claim 1, wherein the first memory cells comprise memory cells at one side of the first erase gate line and memory cells at the other side of the first erase gate line.

7. The logic embedded nonvolatile memory device of claim 1, wherein each of the first memory cells or the second memory cells comprises a selection transistor controlled by a word line and a cell transistor controlled by a control gate line.

8. A nonvolatile memory device comprising:
a cell array including a first erase unit having a plurality of first memory cells that share a first erase gate line, a second erase unit having a plurality of second memory cells that share a second erase gate line, the plurality of first memory cells and the plurality of second memory cells are part of a single row of memory cells, and an erase gate selection switch that is configured to selectively connect a global erase gate line to only one of the first erase gate line and the second erase gate line;
a row decoder that is configured to provide an erase voltage to the global erase gate line in response to a row address; and
a column decoder that is configured to control the erase gate selection switch in response to a column address to select at least one of the first erase unit and the second erase unit.

9. The nonvolatile memory device of claim 8, wherein the erase gate selection switch comprises:
a first high-voltage transistor that is configured to connect the global erase gate line to the first erase gate line in response to a first erase control signal from the column decoder; and
a second high-voltage transistor that is configured to connect the global erase gate line to the second erase gate line in response to a second erase control signal from the column decoder.

10. The nonvolatile memory device of claim 9, wherein the first and second high-voltage transistors share a source terminal that is connected to the global erase gate line.

11. The nonvolatile memory device of claim 9, wherein the first and second high-voltage transistors are in a high-voltage well provided between the first erase unit and the second erase unit.

12. The nonvolatile memory device of claim 8, wherein, during a program operation or a read operation on memory cells included in the first and second erase units, the column decoder is configured to control the erase gate selection switch to connect the global erase gate line to both the first erase gate line and the second erase gate line, and wherein the first and second erase gate lines extend in parallel to the global erase gate line.

13. The nonvolatile memory device of claim 8, wherein each of the memory cells comprises a selection transistor connected to a bit line and a cell transistor connected to a source line, and
wherein gates of the selection transistors of each memory cell are connected to a word line and gates of the cell transistors are connected to a control gate line, and
wherein the first and second erase gate lines are co-linear.

14. A logic embedded nonvolatile memory device comprising:
a cell array that includes a plurality of first memory cells that are connected to a first word line;
a global erase gate line that is configured to receive an erase voltage;
a first erase gate selection switch that is configured to be controlled by a first erase control line;
a first erase gate line that is connected to the global erase gate line via the first erase gate selection switch and that is connected to a first subset of the plurality of first memory cells;
a second erase gate selection switch that is configured to be controlled by a second erase control line; and
a second erase gate line that is connected to the global erase gate line via the second erase gate selection switch and that is connected to a second subset of the plurality of first memory cells,
wherein the first erase gate selection switch is between the first subset of the plurality of first memory cells and the second subset of the plurality of first memory cells.

15. The logic embedded nonvolatile memory device of claim 14, further comprising a plurality of second memory cells that are connected to a second word line, wherein the first erase gate line is connected to a first subset of the plurality of second memory cells and the second erase gate line is connected to a second subset of the plurality of second memory cells.

16. The logic embedded nonvolatile memory device of claim 14, wherein the cell array includes a plurality of second memory cells that are connected to a second word line, the logic embedded nonvolatile memory device further comprising:
a second global erase gate line;
a third erase gate selection switch that is configured to be controlled by the first erase control line;
a third erase gate line that is connected to the second global erase gate line via the third erase gate selection switch and that is connected to a first subset of the plurality of second memory cells;
a fourth erase gate selection switch that is configured to be controlled by the second erase control line; and
a fourth erase gate line that is connected to the second global erase gate line via the fourth erase gate selection switch and that is connected to a second subset of the plurality of second memory cells.

17. The logic embedded nonvolatile memory device of claim 16, wherein the first erase gate selection switch and the third erase gate selection switch are aligned in a first column that extends perpendicular to the first word line.

18. The logic embedded nonvolatile memory device of claim 14, wherein the cell array includes a plurality of second memory cells that are connected to a second word line, the logic embedded nonvolatile memory device further comprising:
a second global erase gate line;
a third erase gate selection switch that is configured to be controlled by a third erase control line;

a third erase gate line that is connected to the second global erase gate line via the third erase gate selection switch and that is connected to a first subset of the plurality of second memory cells;

a fourth erase gate selection switch that is configured to be controlled by a fourth erase control line; and a fourth erase gate line that is connected to the second global erase gate line via the fourth erase gate selection switch and that is connected to a second subset of the plurality of second memory cells, wherein the first erase gate selection switch is not aligned with the third erase gate selection switch along an axis that is perpendicular to the first word line.

19. The logic embedded nonvolatile memory device of claim 14, wherein the first erase gate selection switch and the second erase gate selection switch each comprise a transistor that has a channel length that is longer than channel lengths of cell transistors of the memory cells of the plurality of first memory cells.

\* \* \* \* \*